US008392162B2

(12) United States Patent
Wu et al.

(10) Patent No.: US 8,392,162 B2
(45) Date of Patent: Mar. 5, 2013

(54) VEHICULAR SUPPLEMENTAL RESTRAINT DEVICE SIMULATION USING FINITE ELEMENT MODELING

(75) Inventors: Fubang Wu, Rochester Hills, MI (US); Li Chai, Northville, MI (US); Nripen Saha, Ann Arbor, MI (US)

(73) Assignee: Ford Global Technologies, Dearborn, MI (US)

( * ) Notice: Subject to any disclaimer, the term of this patent is extended or adjusted under 35 U.S.C. 154(b) by 1885 days.

(21) Appl. No.: 11/307,357

(22) Filed: Feb. 2, 2006

(65) Prior Publication Data

US 2007/0179764 A1 Aug. 2, 2007

(51) Int. Cl.
G06F 17/50 (2006.01)
G06F 7/60 (2006.01)
G06F 17/10 (2006.01)
G06G 7/48 (2006.01)

(52) U.S. Cl. ............. 703/8; 703/1; 703/2; 703/6; 703/7

(58) Field of Classification Search ........................ 703/8
See application file for complete search history.

(56) References Cited

U.S. PATENT DOCUMENTS

| | | | | |
|---|---|---|---|---|
| 3,921,129 A * | 11/1975 | Sumida | ...................... | 180/274 |
| 5,355,740 A * | 10/1994 | Beaudet et al. | .............. | 73/865.6 |
| 5,501,259 A | 3/1996 | Palm | | |
| 5,747,683 A * | 5/1998 | Gerum et al. | .............. | 73/117.01 |
| 5,836,611 A * | 11/1998 | Palm | ........................ | 280/743.1 |
| 6,149,194 A | 11/2000 | Breed et al. | | |
| 6,250,668 B1 * | 6/2001 | Breed et al. | ................. | 280/730.2 |
| 6,406,056 B2 * | 6/2002 | Yokota | ....................... | 280/728.2 |
| 6,624,641 B1 * | 9/2003 | Krampitz et al. | ............. | 324/691 |
| 6,715,790 B2 * | 4/2004 | Breed | ......................... | 280/730.2 |
| 6,736,424 B2 | 5/2004 | Specht et al. | | |
| 6,748,307 B1 * | 6/2004 | Sala et al. | ....................... | 701/46 |
| 6,816,766 B2 * | 11/2004 | Sala et al. | ....................... | 701/45 |
| 6,904,399 B2 * | 6/2005 | Cooper et al. | .................. | 703/22 |
| 7,299,677 B2 * | 11/2007 | Musale et al. | ............... | 73/12.01 |
| 7,590,514 B1 * | 9/2009 | Olovsson | ........................ | 703/6 |
| 2001/0026063 A1 * | 10/2001 | Yokota | ......................... | 280/732 |
| 2003/0198767 A1 * | 10/2003 | Breed et al. | .................. | 428/36.1 |
| 2003/0200074 A1 | 10/2003 | Cooper et al. | | |
| 2004/0026906 A1 * | 2/2004 | Takahara | ................... | 280/730.2 |
| 2004/0256842 A1 * | 12/2004 | Breed | ........................ | 280/730.1 |
| 2006/0293820 A1 * | 12/2006 | Hicks | .............................. | 701/45 |
| 2008/0082237 A1 * | 4/2008 | Breed | ............................ | 701/45 |

OTHER PUBLICATIONS

Fokin et al. "On Airbag Simulation in LS-DYNA with the use of the Arbitrary Lagrangian—Eulerian Method". $4^{th}$ European LS-DYNA Conference. 2003.*
Avula et al. "Nonlinear Finite Element Modeling of an Airbag During Inflation and Impact". Mar. 1999.*
Chawla et al. "Mesh Generation for Folded Airbags", 2004.*

(Continued)

Primary Examiner — Shambhavi Patel
(74) Attorney, Agent, or Firm — Jerome R. Drouillard; Frank A. MacKenzie

(57) ABSTRACT

A method and system for modeling an inflatable supplemental restraint device for a vehicle includes operating a simulation system according to a first step in which the restraint device is modeled in a fully inflated configuration using a finite element model. The modeled airbag is then deflated and flattened. The flattened airbag is subjected to simulated folding using a finite element model. Inputs drawn from the results of successive portions of the simulation are used in the later modeling steps.

3 Claims, 4 Drawing Sheets

OTHER PUBLICATIONS

Fokin et al. "On Airbag Simulation in LS-DYNA with the use of the Arbitrary Lagrangian—Eulerian Method". 4th European LS-DYNA Conference. 2003.*

Hallquist et al. "Current and Future Developments of LS-DYNA II", 4th European LS-DYNA Conference. 2003.*

* cited by examiner

VEHICULAR SUPPLEMENTAL RESTRAINT DEVICE SIMULATION USING FINITE ELEMENT MODELING

BACKGROUND OF THE INVENTION

The present invention relates to a method and system for modeling an inflatable supplemental restraint device for a vehicle. Such devices include, without limitation, a driver side airbag (DAB), passenger side airbag (PAB), a side impact airbag (SAB), and a curtain airbag (CAB).

Modeling the contact between the occupant of a vehicle and a supplemental restraint device such as a steering wheel airbag, or side airbag is an important aspect of automotive crash simulation. In order to predict the contact between a vehicle's occupant and an airbag with precision, the airbag must be modeled in terms of the correct configuration, as well as the gas pressure within the airbag and the airbag's trajectory and deployment force. It is known that different bag-folding patterns may significantly influence the character of the airbag's deployment and enhance the interaction between the airbag and the occupant. As a result, a correctly folded airbag finite element model is an important step in assuring proper contact of the airbag and vehicle occupant during a finite element simulation. In addition, the final shape of the airbag is another important factor affecting occupant kinematics and impact characteristics, and it has thus been desirable to use a finite element model of the folded airbag derived directly from its fully deployed shape. However, available airbag folding tools create finite element models of folded airbags from flattened airbags. Therefore, a method has been needed to transfer a 3D airbag model into a 2D model to permit creation of a robust folded airbag model.

The present invention provides a system and method for creating a finite element model of a folded airbag from a finite element model of a fully deployed airbag. By using a finite element explicit tool such as Radioss, LS-DYNA, MADYMO, or PAM-CRASH to simulate the real world airbag folding procedure as the airbag is folded, assembled and packaged, a robust FEA model may be constructed.

SUMMARY OF THE INVENTION

A method for modeling an inflatable supplemental restraint device for a vehicle includes the steps of modeling the restraint device in a fully inflated configuration using a finite element model, and re-configuring the modeled restraint device from a fully inflated to a fully deflated and flattened configuration using data from the model in the fully inflated configuration as input to the finite element model. Thereafter, the results corresponding to the fully deflated and flattened configuration will be used as an input to a finite element model which simulates folding of the restraint device from its fully deflated and flattened configuration to a folded configuration. The present method may further include the step of using data from the modeled folded configuration to model a fully inflated configuration of the supplemental restraint device. Finally, the present method may further include the step of comparing package dimensions of a modeled folded configuration to corresponding package dimensions of a housing for mounting the restraint device within a vehicle.

According to another aspect of the present invention, a restraint device may be modeled as being folded into either a rolled configuration, or a tucked configuration, or a star configuration or other final configurations known to those skilled in the art and suggested by this disclosure.

According to another aspect of the present invention, a system for modeling an inflatable supplemental restraint device for a vehicle includes an implicit finite element model for modeling a supplemental restraint device as the device is transitioned from a fully inflated configuration to a fully deflated and flattened configuration. The present system further includes an explicit finite element model using the results from the implicit modeling to simulate folding of the deflated supplemental restraint device into a package suitable for mounting within the vehicle. As set forth above, the present system may model the folding of the restraint device into a rolled, a tuck, or star configuration, or yet other configurations.

It is an advantage of the present invention that the amount of time and computing resources needed to model a supplemental restraint device may be greatly reduced, as compared with prior modeling techniques.

It is a further advantage of a method and system according to the present invention that the modeling results produced by this system are much more accurate than those produced with known modeling systems.

Other advantages, as well as feature and objects of the present invention, will become apparent to the reader of this specification.

DETAILED DESCRIPTION OF THE PREFERRED EMBODIMENTS

Figure 1:
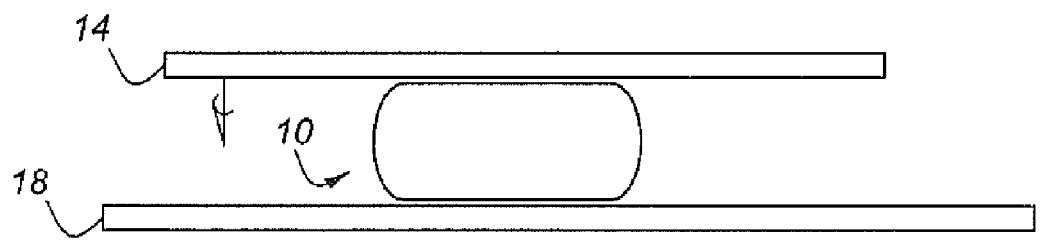
FIG. 1 is a schematic representation of its fully inflated airbag being pressed between two flat plates.
Figure 2:
FIG. 2 is similar to FIG. 1 but shows an airbag in a fully flattened position.
Figure 6:
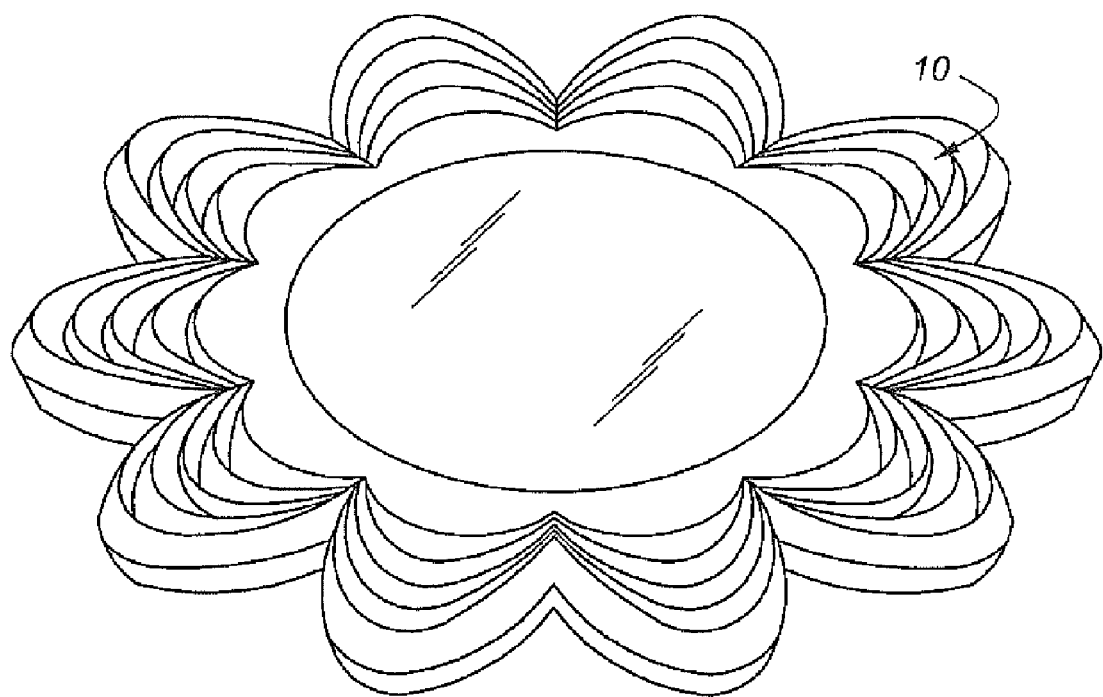
FIG. 6 is a star-shaped supplemental restraint device shown in a fully deployed position.

As shown in FIG. 1, the present simulation begins with airbag 10 in a fully inflated configuration. The airbag shown in FIG. 1, which is similar to the airbag of FIG. 6, is the result of a simulation performed using a finite element model. This is shown in step 44 of FIG. 8. Airbag 10 is positioned between ground plane 18 and flat plate 14. In FIG. 2, modeled airbag 10 is squeezed between plane 18 and plate 14 and transitioned to a deflated and flattened state, as shown in step 46 of FIG. 8. This simulated reconfiguration uses data from the model of the fully inflated configuration. Once again, the simulation proceeds with a finite element model. The simulation of the flattening process includes the modeling of uniform gas pressure within airbag 10. Further, small venting holes are modeled in airbag 10 so as to release gas during the modeled flattening process. To preserve original model quality and numerical convergence, contacts between the airbag fabric lays are included in the modeled flattening process.

Figure 3:
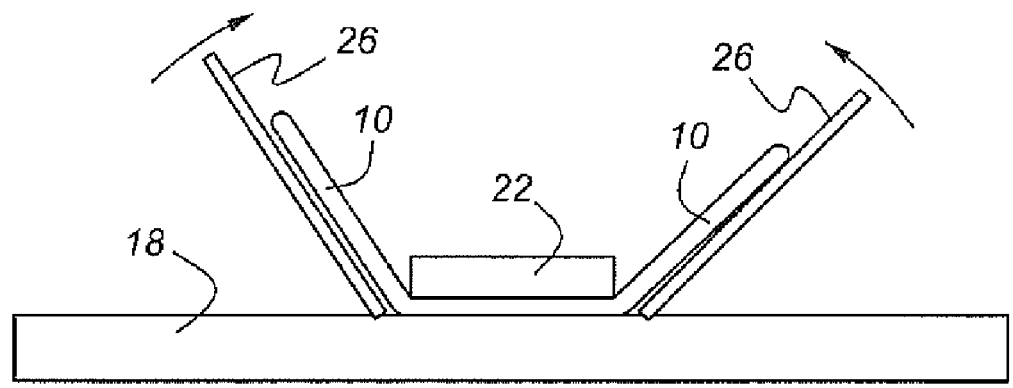
FIG. 3 shows the airbag of FIGS. 1 and 2 being folded into a planar configuration.
Figure 4:
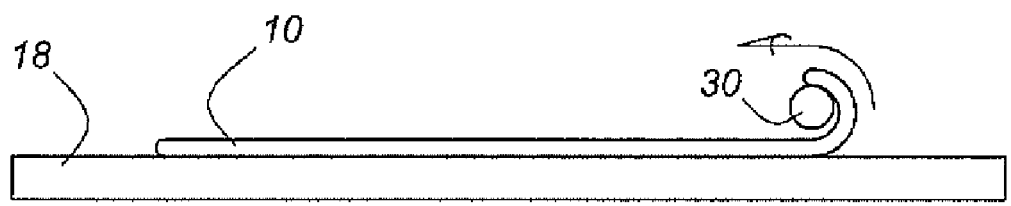
FIG. 4 shows the airbag of FIGS. 1 and 2 being folded into a rolled configuration.
Figure 5:
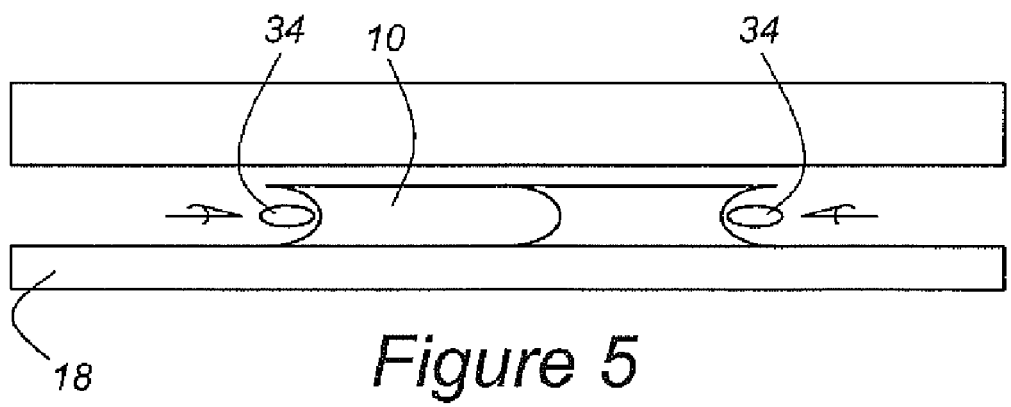
FIG. 5 shows the airbag of FIGS. 1 and 2 being folded into a tuck configuration.

In FIGS. 3, 4 and 5, simulated continuous folding of airbag 10 occurs. This is done according to step 48 of FIG. 8, using a finite element model with mesh data from the previously modeled flattening process step. The finite element model uses input data from step 46 of FIG. 8. The model can be used at step 52 of the simulation to produce either the flattened, folded configuration shown in FIG. 3, or the rolled configuration shown in FIG. 4, or the tucked configuration of FIG. 5, or the folded configuration required to produce the fully inflated star configuration shown in FIG. 6. In FIG. 3, airbag 10 is maintained in contact with plane 18 by block 22 and simultaneously folded by folding leaves 26. In FIG. 4, airbag 10 is rolled about roller 30. Finally, in FIG. 5, airbag 10 is formed into a tucked configuration by folding mandrels 34. Each of these foldings may be simulated, for example, with an explicit finite element model.

Figure 7:
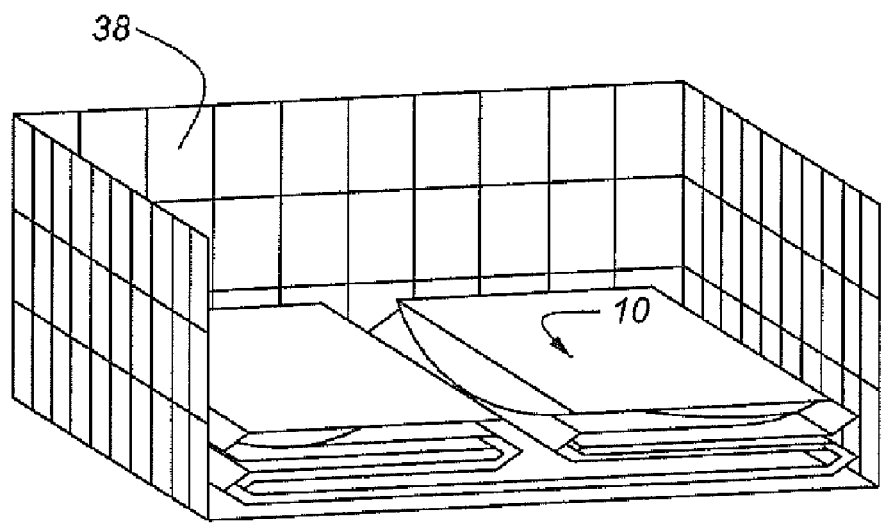
FIG. 7 illustrates a folded airbag placed within a simulated restraint housing mounting within a vehicle.
Figure 8:
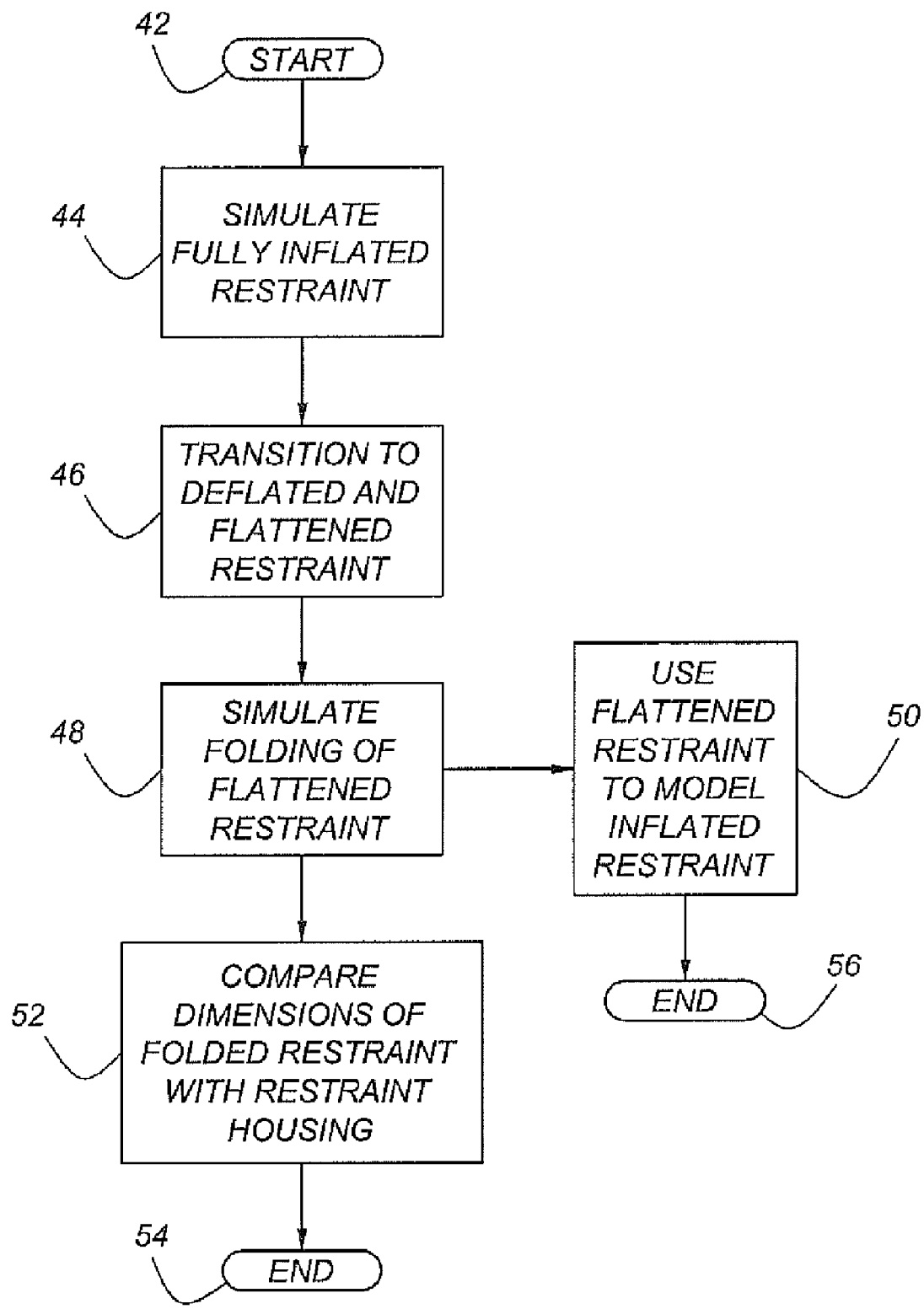
FIG. 8 is a flow diagram illustrating a method according to the present invention.

At step 50 of FIG. 8, the flattened restraint model, in this case an explicit finite model, is used to model the inflated restraint, so as to verify the accuracy of the folded model, and to thereby certify use of the folded model in the crash simulation. Another step is shown in FIG. 8 at step 52, in which the dimensions of folded restraint 10 are compared to restraint housing 38 for mounting the restraint within a vehicle. This comparison is shown in FIG. 7, where once again, the airbag is not reduced to a physical specimen, but rather modeled in software, as is restraint housing 38. As part of the step shown in FIG. 7, insertion of airbag 10 into housing 38 preferably includes defining a number of contacts between the lays of the folded airbag and the housing.

Although the present invention has been described in connection with particular embodiments thereof, it is to be understood that various modifications, alterations, and adaptations may be made by those skilled in the art without departing from the spirit and scope of the invention set forth in the following claims.

What is claimed is:

1. A method for modeling an inflatable supplemental restraint device for a vehicle, comprising the steps of:
    modeling the restraint device in a fully inflated state, using a finite element model; reconfiguring the modeled restraint device from a fully inflated to a fully deflated and flattened configuration using data from the model of the fully inflated state in the finite element model;
    using the results corresponding to the fully deflated and flattened configuration as an input to a finite element model to simulate continuous folding of the restraint device from its fully deflated and flattened configuration to a folded configuration;
    comparing package dimensions of the modeled folded configuration to corresponding package dimensions of a housing for said restraint device; and
    using the modeled folded configuration to model a fully inflated configuration of said supplemental restraint device.

2. A method according to claim 1, wherein said airbag is modeled as having small venting holes and uniform gas pressure within the airbag as the airbag is reconfigured to said fully deflated and flattened configuration.

3. A method according to claim 1, wherein said airbag is compared with said housing by simulating insertion of said folded airbag into said housing with defined contacts between a plurality of lays of the folded airbag and the housing.

* * * * *